United States Patent
Claasen-Vujcic et al.

[11] Patent Number: 6,107,800
[45] Date of Patent: Aug. 22, 2000

[54] MAGNETIC RESONANCE APPARATUS

[75] Inventors: Tatjana Claasen-Vujcic, Amersfoort; Gerardus B. J. Mulder; Gerardus N. Peeren, both of Eindhoven, all of Netherlands

[73] Assignee: U.S. Philips Corporation, New York, N.Y.

[21] Appl. No.: 08/880,374

[22] Filed: Jun. 23, 1997

[30]  Foreign Application Priority Data

Jul. 12, 1996 [EP] European Pat. Off. ............ 96201973

[51] Int. Cl.$^7$ ........................................... G01V 3/00
[52] U.S. Cl. ................................. 324/319; 324/320
[58] Field of Search ................... 324/319, 318, 324/320, 300, 307, 309

[56]  References Cited

U.S. PATENT DOCUMENTS

| | | | |
|---|---|---|---|
| 4,670,716 | 6/1987 | Kunz | 324/309 |
| 5,345,178 | 9/1994 | Manabe et al. | 324/320 |

FOREIGN PATENT DOCUMENTS

WO9604565  2/1996  WIPO .

OTHER PUBLICATIONS

"Concomitant Magnetic Field Gradients and Their Effects on Imaging at Low Magnetic Field Strengths", David G. Norris and James M.S. Hutchison, Magnetic Resonance Imaging, vol. 8, pp. 33–37, 1990.

"Reduction of Concomitant Field Gradient Effeccts by Main Field Alternation", T. Claasen–Vujcic, J. Slotboom, A.F. McHikopf, SMR 3rd Annual Meeting.

"Magnetic Field Profiling: Analysis and Correcting Coil Design", Francoise Romeo and D.I. Hoult, Magnetic Resonance in Medicine, 1984.

J.A.M. Dam and K. Pieterman, "Surface Cooled, Vacuum Inpregnated Superconducting Magnet Systems" (Thesis Tu Delft, 1989), pp. 120–121.

*Primary Examiner*—Louis Arana
*Attorney, Agent, or Firm*—Dwight H. Renfrew

[57]  ABSTRACT

Magnetic resonance apparatus includes a magnet system for generating a steady magnetic field in a measuring space, which steady magnetic field is oriented mainly parallel to one of the axes of an orthogonal coordinate system, a gradient system with gradient coil systems and with a controlled source for supplying the gradient coil systems with excitation currents with a predetermined variation in time. The gradient coil systems include a number of linear gradient coil systems, each of which is arranged to generate a main gradient field which is dependent on the location of the field in the measuring space in such a manner that a magnetic field formed by superposition of one of the main gradient fields on the steady magnetic field can be described, as a function of the coordinates of the coordinate system, as a series containing first-order terms and higher-order terms, the first-order terms having predetermined coefficients which are equal to zero for two of the coordinates. The gradient system is arranged so that at least a part of the second-order terms of the series describing the magnetic field formed by superposition of the magnetic fields generated by the gradient system on the steady magnetic field have predetermined coefficients. The undesirable effects of concomitant gradient fields can thus be counteracted.

8 Claims, 4 Drawing Sheets

MAGNETIC RESONANCE APPARATUS

BACKGROUND OF THE INVENTION

1. Field of the Invention

The invention relates to a magnetic resonance apparatus, including a magnet system for generating a steady magnetic field in a measuring space, which steady magnetic field is oriented mainly parallel to one of the axes of an orthogonal coordinate system, a gradient system with gradient coil systems and control means for supplying the gradient coil systems with excitation currents with a predetermined variation as a function of time, the gradient coil systems including a number of linear gradient coil systems, each of which is arranged to generate a main gradient field which is dependent on the location in the measuring space in such a manner that a magnetic field formed by superposition of one of the main gradient fields on the steady magnetic field can be described, as a function of the coordinates of the coordinate system, as a series containing first-order terms and higher-order terms, the first-order terms having predetermined coefficients equal to zero for two of the coordinates.

2. Description of the Related Art

A magnetic resonance apparatus of this kind is known, for example from WO 96/04565 which corresponds to U.S. Pat. No. 5,572,133. The direction of the steady magnetic field is generally referred to as the z-direction in an orthogonal coordinate system, the other coordinates being referred to as x and y. As a rule a linear gradient coil system is provided for each of the three coordinate directions. These gradient coil systems serve to generate main gradient fields whose component in the z-direction is dependent on the three coordinates as $G_x x$, $G_y y$ and $G_z z$, respectively, $G_x$, $G_y$ and $G_z$ being predetermined constants. The magnetic field obtained in the z-direction by superposition of such a main gradient field on the steady magnetic field is linearly dependent on one of the coordinates. However, it is physically impossible to produce an isolated field gradient in the z-direction. Because the magnetic fields satisfy Maxwell's equations, such a field gradient is always accompanied by another field gradient (concomitant field gradient) which extends perpendicularly to the z-direction. The theoretical background of this phenomenon is described in Magn. Reson. Imaging, 8, 33–37 (1990). Because of these fields the amplitude of the field obtained by superposition of the steady magnetic field and the main gradient field is no longer only linearly dependent on a coordinate, but can be described by a series which also contains higher-order terms in the spatial coordinates.

It has been found that the concomitant field gradients may have disturbing effects if the amplitude of the steady magnetic field has a comparatively low value. Some possible consequences are the selection of warped slices, loss of signal-to-noise ratio (SNR) and image artifacts. Disturbing effects of the concomitant field gradients are sometimes also noticeable during some measurements involving higher steady fields (for example, EPI). It has been proposed to solve this problem for EPI experiments by reversing the polarity of the steady magnetic field; in this respect see SMR, 3rd Annual Meeting, 314 (1995). This method does not offer a solution in respect of selection of warped slices. Moreover, this method can be used only for comparatively low field strengths of the steady magnetic field. Switching over $B_0$ is actually feasible only in that case.

SUMMARY OF THE INVENTION

It is an object of the invention to provide a magnetic resonance apparatus of the kind set forth whereby the adverse effects of the concomitant field gradients can also be reduced for experiments other than EPI, without it being necessary to reverse the polarity of the steady magnetic field. To achieve this, the apparatus according to the invention is characterized in that the gradient system is arranged in such a manner that at least some of the second-order terms of the series describing the magnetic field formed by superposition of the magnetic fields generated by the gradient system on the steady magnetic field have predetermined coefficients.

The amplitude $B_{tot}$ of the total magnetic field (the steady field plus the field gradients) can generally be represented by the following series:

$$B_{tot} = B_0 + G_x x + G_y y + G_z z + Ax^2 + By^2 + Cz^2 + \ldots \quad (1)$$

Therein, $B_0$ is the amplitude of the steady magnetic field and A, B and C are constants which can never be simultaneously zero if at least one of the coefficients $G_x$, $G_y$ and $G_z$ is unequal to zero. For large values of $B_0$ (for example, >0.5 T), A, B and C can generally be ignored. The invention is based on the recognition of the fact that it is possible to impart an arbitrary, predetermined value to two of these constants. The higher-order terms in (1) can thus be manipulated. The quadratic terms are most disturbing. As has already been stated, they cannot all become zero at the same time; however, for given experiments a preference may exist for a given value of one of these terms.

An embodiment of the apparatus according to the invention is characterized in that the gradient coil system includes not only the linear gradient coil systems but also additional coil systems which serve to generate at least an additional magnetic field whose component in the direction of the steady magnetic field is dependent on second-order terms in the coordinates in a predetermined manner. Suitable selection of the properties of the additional coil systems gives the designer a powerful tool for manipulation of the higher-order terms in (1). It has been found that the second-order terms can be manipulated by using five adequate additional coils which are suitably driven. When more coils are used, if desired, other terms can also be manipulated.

A further embodiment, in which the coordinates are denoted by the letters x, y and z, the steady magnetic field is oriented mainly in the z-direction and has an amplitude $B_0$, and the z components of the main gradient fields generated by the linear gradient coil systems can be described as $G_x x$, $G_y y$ and $G_z z$, where $G_x$, $G_y$ and $G_z$ are predetermined constants, is characterized in that the z-component of at least one of the additional magnetic fields generated by the additional coil systems satisfies one of the following relations for $B_{1z}$, $B_{2z}$, $B_{3z}$, $B_{4z}$ and $B_{5z}$:

$$B_{1z} = K_1 \left( z^2 - \frac{x^2}{2} - \frac{y^2}{2} \right),$$

$$B_{2z} = K_2 (x^2 - y^2),$$

$$B_{3z} = K_3 xy,$$

$$B_{4z} = K_4 xz,$$

$$B_{5z} = K_5 yz,$$

where $K_1$ to $K_5$ are constants.

$K_1$ to $K_5$ are proportionality constants which are dependent on $B_0$, $G_x$, $G_y$ and $G_z$ and on the object of the relevant experiment which determines which second-order terms must have a predetermined value and what that value should be. As will be explained in detail hereinafter, said additional magnetic fields are particularly suitable for eliminating or mitigating given adverse effects of the concomitant field gradients.

These and other aspects of the invention will be described in detail hereinafter with reference to the drawing.

DETAILED DESCRIPTION OF THE PREFERRED EMBODIMENTS

Figure 1:
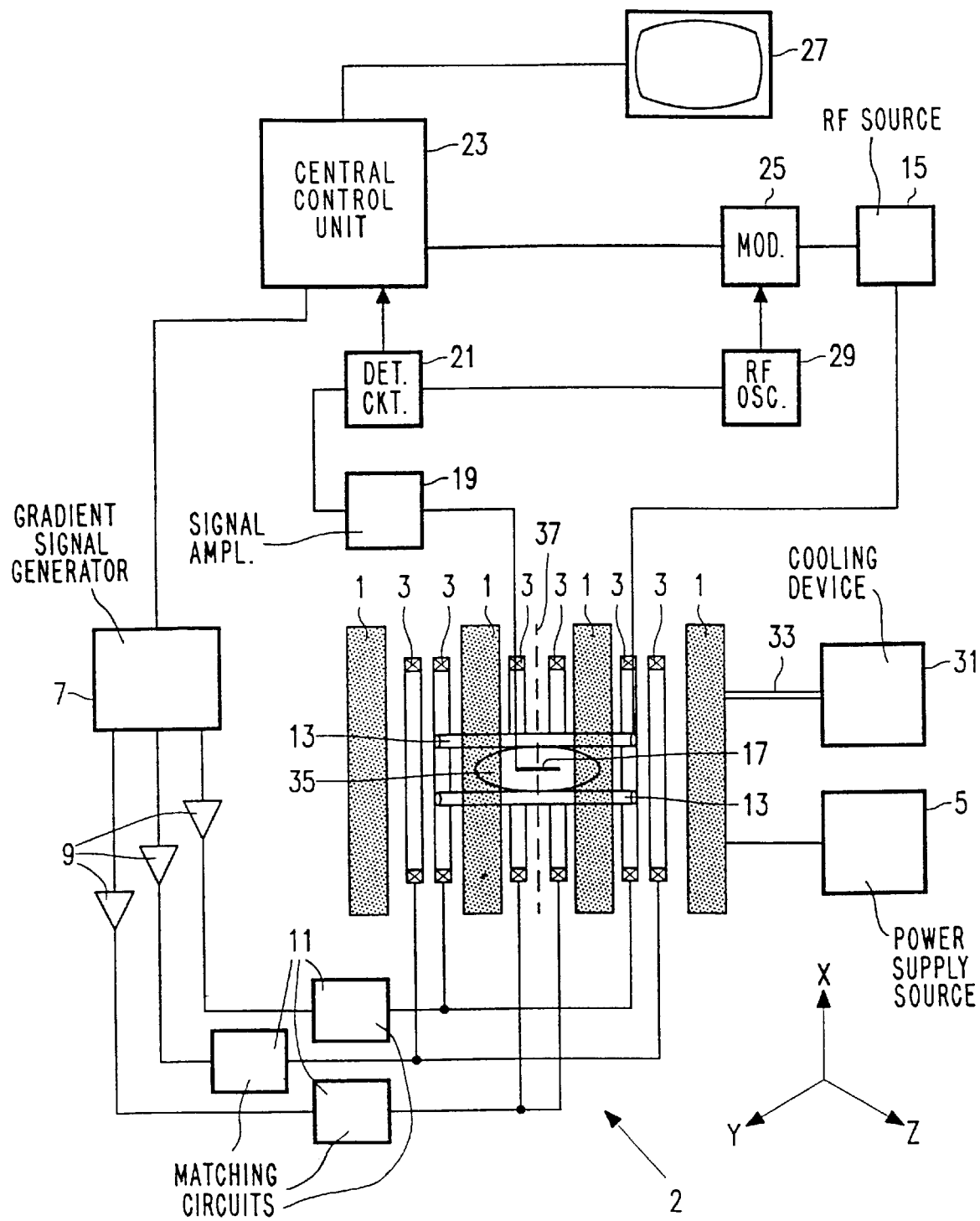
FIG. 1 shows a block diagram of an embodiment of a magnetic resonance apparatus according to the invention.

A magnetic resonance apparatus as shown in FIG. 1 includes a magnet system 1 for generating a steady, uniform magnetic field. The apparatus also includes a gradient system 2 with gradient coil systems 3 for generating magnetic gradient fields. A power supply source 5 may be provided to feed the magnet system 1. The gradient system 2 also includes a gradient signal generator 7 and a number of gradient amplifiers 9, which number amounts to three in the present embodiment. Each gradient amplifier 9 is connected to an output circuit which may include a matching circuit 11 in addition to one of the gradient coil systems 3. In conjunction with the gradient amplifiers 9, the gradient signal generator 7 constitutes control means for supplying the gradient coil systems 3 with an excitation current with a predetermined variation as a function of time. A magnet coil 13 serves to generate an RF magnetic alternating field and is connected to an RF source 15. A surface coil 17 is indicated for the detection of magnetic resonance signals generated in an object to be examined by the RF transmitted field. For the purpose of reading the coil 17 is connected to a signal amplifier 19. The signal amplifier 19 is connected to a phase-sensitive rectifier type detector circuit 21 which is connected to a central control device 23. The central control device 23 also controls a modulator 25 for supplying modulated RF signal to the RF source 15, controls the gradient signal generator 7, and generates a display signal supplied to a monitor 27. An RF oscillator 29 feeds the modulator 25 as well as the detector circuit 21 which detects the measuring signals. For cooling, if any, there is provided a cooling device 31 with cooling ducts 33. The transmitter coil 13, arranged within the magnet systems 1 and 3, generates an RF field in a measuring space 35 which is large enough to accommodate a patient in the case of a medical diagnostic apparatus. Thus, a steady magnetic field, gradient fields for position selection of slices to be imaged, and a spatially uniform RF alternating field can be generated in the measuring space 35.

The direction of the steady magnetic field extends mainly parallel to the Z axis of an orthogonal coordinate system which also comprises an X-axis and an Y-axis. The directions of these coordinate axes are shown in an arbitrary location in FIG. 1 for the sake of clarity. In reality the origin of the coordinate system is situated at the center of the measuring space 35. The measuring space 35 and the gradient coil systems 3 are usually situated symmetrically with respect to a symmetry plane 37 which corresponds to the X-Y plane of said coordinate system.

The gradient coil systems 3 contain a number of linear gradient coil systems (usually three), each of which is arranged to generate a main gradient field which, in the direction of the steady magnetic field (z-direction), is linearly dependent on the location in the measuring space 35. This main gradient field is superposed on the steady magnetic field $B_0$, yielding a resultant magnetic field $B_{res}$ whose amplitude $|B_{res}|$ can generally be described as:

$$|B_{res}| = B_0 + G_i i + A_i x^2 + B_i y^2 + C_i z^2 + \ldots \quad (2)$$

Therein, i denotes one of the coordinates x, y or z and G, A, B and C are constants. The resultant magnetic field can thus be described as a series containing first-order terms and higher-order terms, all first-order terms but one having the coefficient zero. If the three main gradient fields are superposed on the steady magnetic field, the total magnetic field in the measuring space 35 can be described by the above formula (1). The linear gradient coil systems may be conventional systems, for example a Helmholz pair for the main gradient field which is dependent on z, and two pairs of saddle coils for the main gradient fields which are dependent on x and on y, respectively.

As is described in detail in the cited document Magn. Reson. Imaging 8, 33–37, for each of the linear gradient coil systems the expression (2) can be derived in detail by means of Maxwell's equations. For example, when the main gradient field which is dependent on z is used (with cylinder symmetry), the expression is given by:

$$|B_{res}| = B_0 + G_z z + \frac{G_z^2}{8B_0} r^2 + \ldots \quad (3)$$

Therein, $r^2 = x^2 + y^2$. The resultant magnetic field thus has not only a linear dependency on z, as is intended, but also a quadratic dependency on x and y. If the z gradient is used to select slices extending perpendicularly to the Z-axis, the quadratic terms in x and y cause warping of the selected slice. However, it has been found that the higher-order terms in the expression (3) can be manipulated in such a manner that the disturbing terms in $x^2$ and $y^2$ are replaced by a term in $z^2$. This can be achieved, for example by providing the linear gradient coil system for the Z direction with additional coils, so that the resultant gradient coil system generates a field which is dependent mainly on z. In the expression (3), for example the radial component (dependent on r) can be eliminated to the fourth power if the z component of the field generated by such a coil system satisfies:

$$B_z = G_z z + \frac{G_z^2}{4B_0}\left(z^2 - \frac{r^2}{2}\right) \quad (4)$$

It can be readily demonstrated that the amplitude of the resultant field $B_{res}$ then satisfies:

$$|B_{res}| = B_0 + G_z z + \frac{G_z^2}{4B_0} z^2 + \frac{G_z^4}{128B_0^3} r^4 + \ldots \quad (5)$$

Consequently, in respect of first-order and second-order terms this field is dependent only on z. It has been found that fourth-order and higher-order terms do not have any or hardly any disturbing effect.

If the z-gradient field is generated by means of a single coil, the expression (4) is satisfied for only one given gradient value (assuming that $B_0$ is constant). It has been found that when more coils are used, the undesirable terms (in this case the second-order terms) of r can be eliminated regardless of the gradient strength. The gradient coil system for the z-gradient then comprises a linear gradient coil system for generating the field gradient typical of magnetic resonance systems (the first term in the right-hand member of (4)) and an additional coil system for generating an additional magnetic field (the second term in the right-hand member of (4)).

It has been found that the use of five additional coils enables an arbitrary value to be given to the coefficients of two of the quadratic terms in the expression (1). The values selected for this purpose are dependent inter alia on the type of experiment to be carried out. Some examples in this respect will be described hereinafter, the suffixes s, e and a being used for the selection direction, the evolution direction and the acquisition direction, respectively; evidently, each of these suffixes may have the values x, y or z or a linear combination of these values.

1. Selection.

Figure 2:
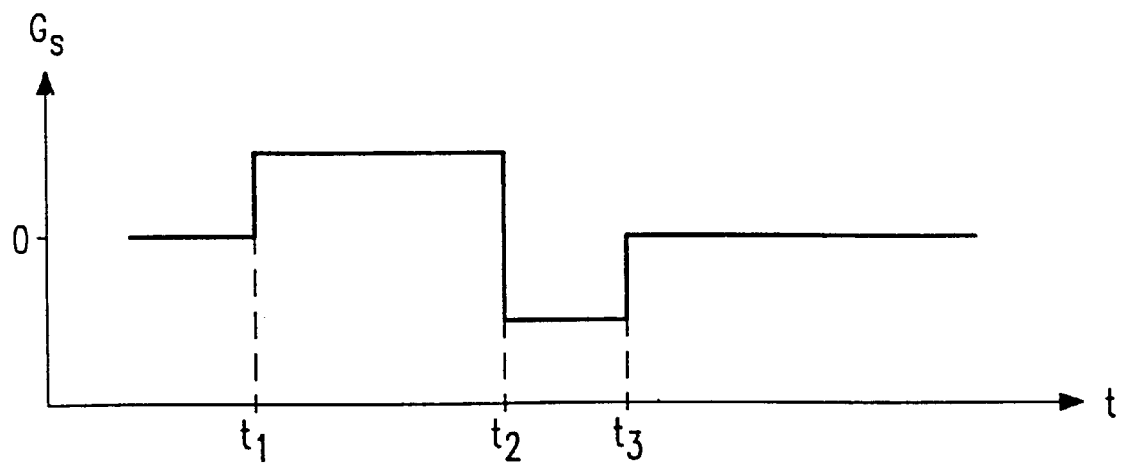
FIGS. 2 and 3 show some examples of gradient pulses.

FIG. 2 shows diagrammatically the amplitude of a customary selection pulse as a function of time t. Selection takes place between $t_1$ and $t_2$ and the rephasing of the spins between $t_2$ and $t_3$. In order to avoid warped slices, it is important that during the selection pulse the total magnetic field $B_{tot}$ (steady field plus gradient field) is dependent mainly on one direction only, that is to say on the selection direction s. The requirement to be satisfied during selection is, therefore:

$$B_{tot}=B_0+G_s s+L_1 s^2 \quad (6)$$

In this expression $L_1$ is a constant which is dependent on $G_s$ and $B_0$. Because the quadratic contribution is not rephased upon reversal of the sign of the selection gradient at the instant $t_2$ in order to rephase the spins, a phase variation occurs within the slice thickness $\Delta s$ which is proportional to s and leads to loss of signal. This loss of signal is negligibly small in thin slices and in slices around the center of the measuring space 35 (FIG. 1). For other slices, however, the loss of signal may become inadmissibly large. This loss of signal cannot be compensated upon reversal of the sign of the linear gradient. The additional coils enable reversal of the sign of the quadratic term in the selection direction after the selection. The additional coils can be controlled, for example in such a manner that between $t_2$ and $t_3$ the amplitude of the magnetic field is given by:

$$|B_{tot}|=B_0-G_s s-L_1 s^2+L_2 a^2 \quad (7)$$

In that case a quadratic term occurs not only in the selection direction but also in one of the other directions. Because the selection has been terminated at that instant, this term does not contribute to the warping of the slices. However, a phase variation is introduced in the a direction or the e direction. Correction for this phase variation can be made in the signal processing phase. It is to be noted, however, that such a phase variation also occurs if no additional coils are used during the selection.

2. Evolution and acquisition.

The additional coils enable the second-order terms to be selected so that their adverse effects are minimized for a given experiment. For example, it can be ensured that the concomitant field upon acquisition and evolution is always dependent exclusively on the selection coordinate. To this end, the total field upon acquisition must be given by:

$$|B_{tot}|=B_0+G_a a+L_3 s^2 \quad (8)$$

As a result, no distortions will occur in the acquisition and evolution directions, because the "same" offset is imparted to all spins, depending on the slice position s. This can be used only if the loss of signal during rephasing within the slice thickness is small.

Figure 3:
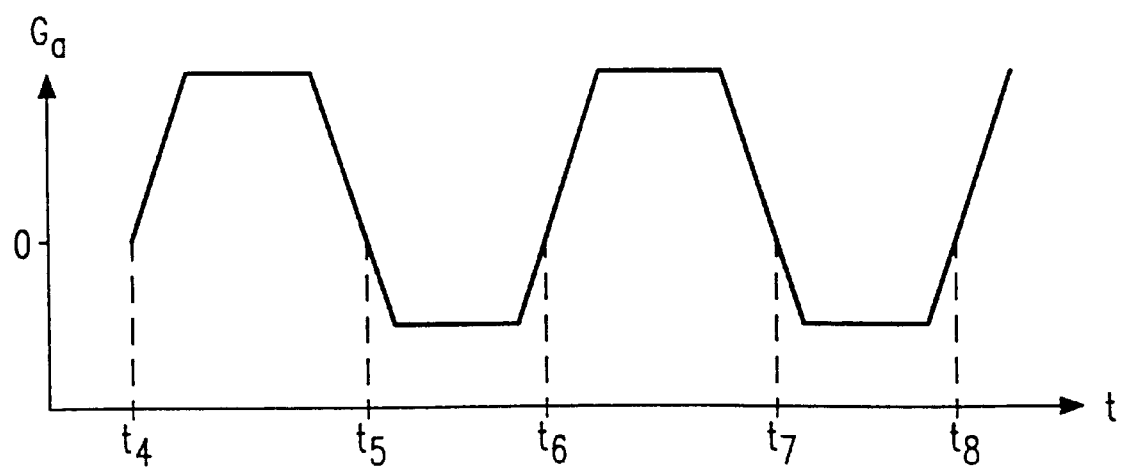

Such a method can also be used for EPI-like experiments. During such experiments quadratic contributions are accumulated, so that in the case of a low field image artifacts may become particularly large and be visible even in the case of a field of 0.5 T. FIG. 3 shows diagrammatically the amplitude as a function of time t of the linear gradient during the acquisition in such an experiment. At the instants $t_4$, $t_5$, $t_6$, $t_7$, $t_8$, . . . the sign of the linear gradient is reversed. The additional coils can ensure that at these instants the sign of the quadratic contribution is also reversed so as to compensate the preceding error. To this end, the additional coils are controlled so that:

$$|B_{tot}| = B_0 + G_a a + L_3 s^2 \text{ for } t_4 < t < t_5$$
$$|B_{tot}| = B_0 - G_a a - L_3 s^2 + L_4 a^2 \text{ for } t_5 < t < t_6$$
$$|B_{tot}| = B_0 + G_a a - L_4 a^2 + L_5 s^2 \text{ for } t_6 < t < t_7$$
$$|B_{tot}| = B_0 - G_a a - L_5 s^2 + L_6 a^2 \text{ for } t_7 < t < t_8, \text{ etc.}$$

The five additional coils must be designed so that they are capable of generating magnetic fields having the following z components:

$$B_{1z} = K_1\left(z^2 - \frac{x^2}{2} - \frac{y^2}{2}\right) \quad (9)$$

$$B_{2z} = K_2(x^2 - y^2) \quad (10)$$

$$B_{3z} = K_3 xy \quad (11)$$

$$B_{4z} = K_4 xz \quad (12)$$

$$B_{5z} = K_5 yz \quad (13)$$

Therein, $K_1$ to $K_5$ are constants which are chosen so that the fields generated by the additional coils have the appearance required for the desired result. For the situation described above with reference to FIG. 2, for example, in order to obtain flat slices $K_1$ may be equal to $G_z^2/(4B_0)$ during the selection (with z as the selection direction), whereas $K_2$ to $K_5$ are equal to zero. $|B_{tot}|$ then equals $B_0+G_z z+G_z^2 z^2/(4B_0)+$ . . . . During rephasing, $K_1$ as well as $K_2$ can be equal to $-G_z^2/(4B_0)$, whereas $K_3$, $K_4$ and $K_5$ are equal to zero. In that case: $|B_{tot}|=B_0+G_z z-G_z^2 z^2/(4B_0)+G_z^2 y^2/(2B_0)+$ . . . . If $G_y$ is the linear acquisition gradient during the acquisition, x is the selection direction and it is desired that exclusively dependency on $x^2$ occurs during the acquisition, $K_1$ must be equal to $-G_y^2/(2B_0)$ and $K_2$ must be equal to $G_y^2/4B_0)$, whereas the other Ks are equal to zero. In that case: $|B_{tot}|=B_0+G_y y+G_y^2 x^2/2B_0)+$ . . . .

Figure 4:
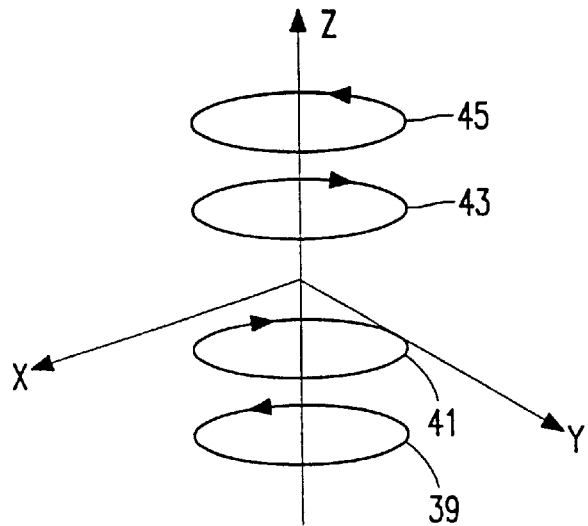
FIGS. 4 to 6 show some examples of suitable additional gradient coil systems.
Figure 5:
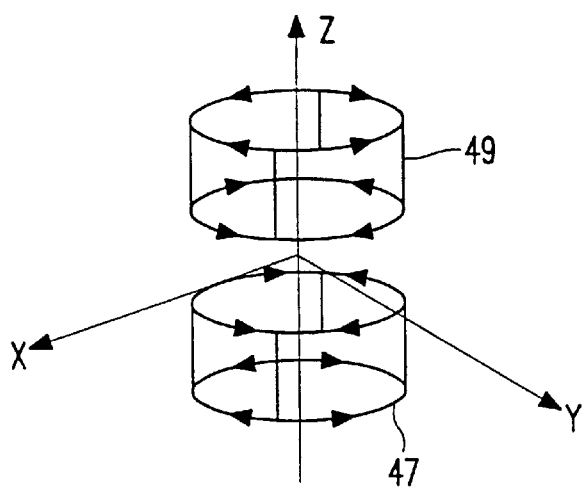
Figure 6:
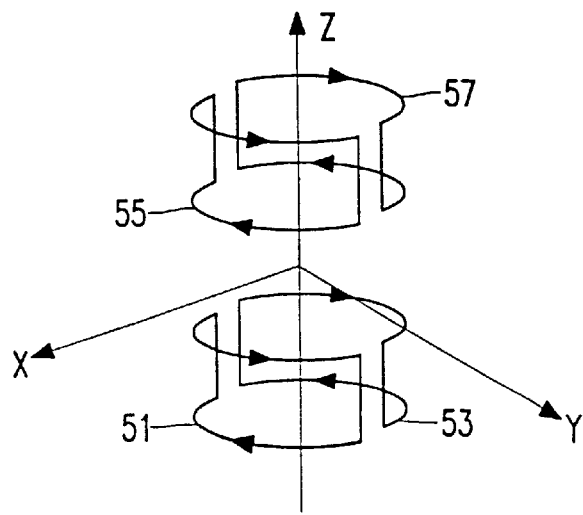

The additional coil systems can be designed subject to the same rules as known for the design of coil systems for generating uniform magnetic fields. Examples thereof are described in Magnetic Resonance in Medicine 1, 44–65 (1984) and in J. A. M. Dam and K. Pieterman, Surface cooled, vacuum impregnated superconducting magnet systems (thesis TU Delft, 1989), 120–121. FIGS. 4, 5 and 6 show diagrammatically some examples of coil systems which are suitable for use as an additional coil system. FIG. 4 shows an example of an additional coil system for generating an additional magnetic field which satisfies the relation (9). It includes four mainly circular coils 39, 41, 43 and 45 whose centers are situated on the Z-axis, said coils being symmetrically arranged relative to X-Y plane (which coincides with the symmetry plane 37 in FIG. 1). These coils are connected in such a manner that the current direction in the outer coils 39 and 45 (the coils situated furthest from the X-Y plane) opposes the current direction in the inner coils 41 and 43. The diameters, spacing and numbers of turns of the coils can be chosen so that the factor $K_1$ has a desired value when they are energized by a suitable current. FIG. 5 shows an example of an additional coil system for generating an additional magnetic field which satisfies the relation (10). It includes two coils 47 and 49 which are constructed as bird-cage coils. The coils have a cylindrical shape and their axes coincide with the Z axis. They are symmetrically arranged relative to the X-Y plane. The currents flow as denoted by the arrows in the coils. The desired value of the constant $K_2$ can be adjusted by suitably choosing the dimensions and location of the coils 47 and 49 and the current through these coils. FIG. 6 shows an example of an additional coil system for generating an additional magnetic field which satisfies the relation (12). It includes two pairs of saddle-shaped coils 51, 53 and 55, 57, the coils of each pair being symmetrically situated relative to the YZ-plane and both pairs being symmetrically arranged with respect to the XY plane. The current directions in these coils are denoted by arrows. The value of the constant $K_4$ can be adjusted again by suitably choosing the dimensions, numbers of turns and the position of the coils and the current through the coils. Further suitable additional coil systems, also for generating additional magnetic fields satisfying the relations (11) and (13), can be readily derived from said publications and other publications.

In some cases it is desirable to select slices which do not extend perpendicularly to one of the axes of the coordinate system. In that case the slices are also warped if the customary gradient coil systems are used. On the basis of calculations and experiments it can be determined that in order to select plane slices in all circumstances, the additional magnetic fields generated by the additional coil systems must be shaped in conformity with the formula (9) to (13), the constants $K_1$ to $K_5$ then having the following values:

$$B_{1z} = K_1\left(z^2 - \frac{x^2}{2} - \frac{y^2}{2}\right) \tag{9}$$

$$B_{2z} = K_2(x^2 - y^2) \tag{10}$$

$$B_{3z} = K_3 xy \tag{11}$$

$$B_{4z} = K_4 xz \tag{12}$$

$$B_{5z} = K_5 yz \tag{13}$$

Therein:

$$c = \frac{0.5 G_z^2 + G_x^2 + G_y^2}{2B_0(G_z^2 + G_x^2 + G_y^2)}. \tag{19}$$

Figure 7:
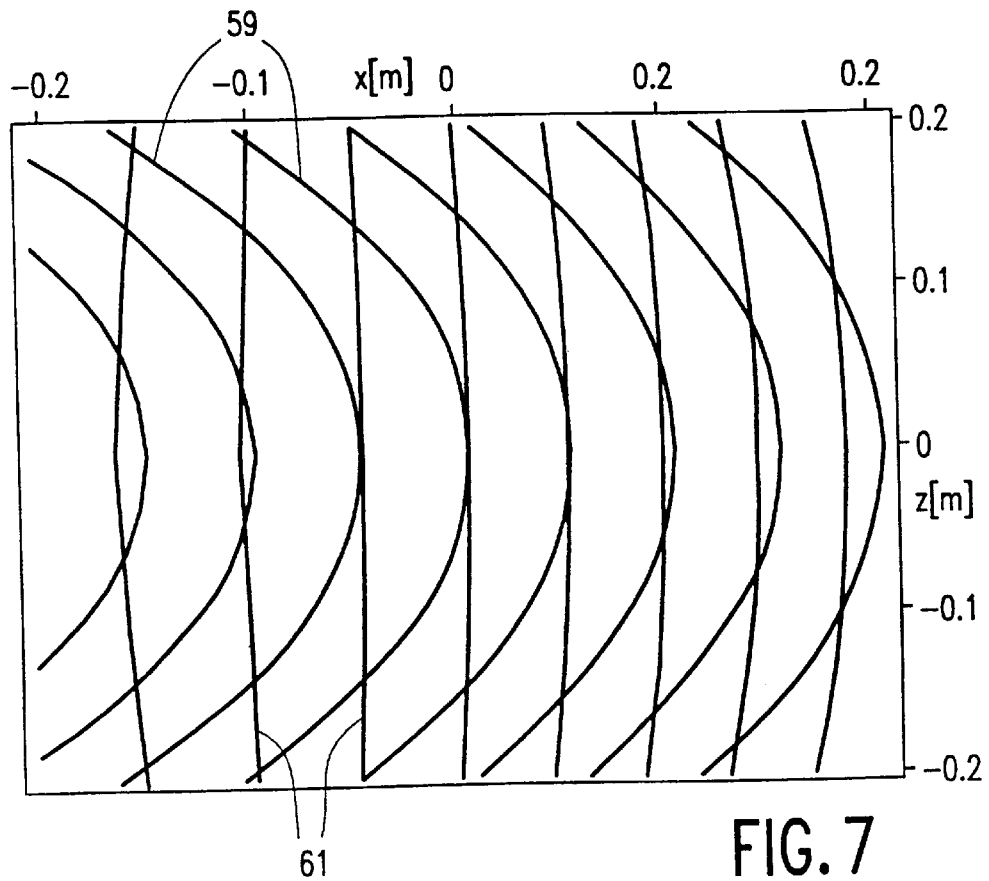
FIGS. 7 and 8 show some diagrams illustrating the effect of the steps according to the invention on the shape of selected slices.
Figure 8:
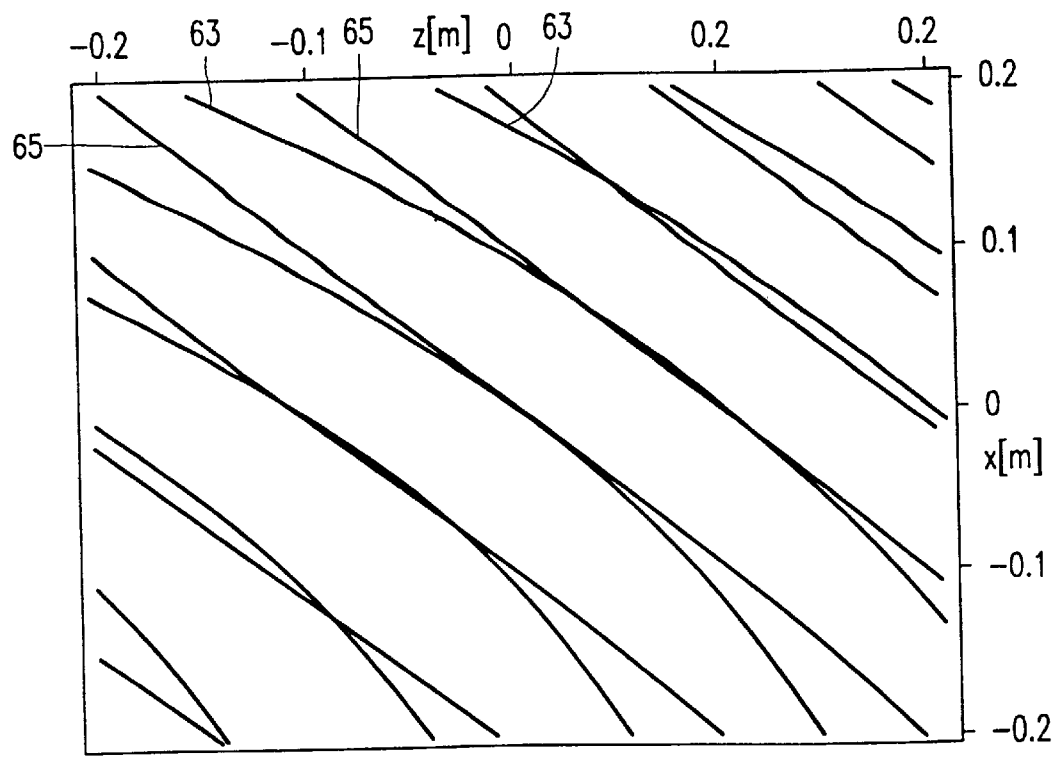

FIGS. 7 and 8 show examples of the results that can be obtained by means of the apparatus according to the invention. FIG. 7 shows the shape of slices extending perpendicularly to the X-axis, the reference 59 representing the shape obtained by means of gradient systems customarily used thus far, and the reference 61 represents the shape obtained after addition of suitable additional gradient coil systems. FIG. 8 shows a similar diagram for slices extending at an angle of approximately 45° relative to the X-axis and the Z-axis. The shape of the slices obtained by means of conventional gradient coil systems is denoted by the reference 63 and that obtained by means of the apparatus according to the invention is denoted by the reference 65.

We claim:

1. A gradient coil system for use in a magnetic resonance (MR) apparatus having a magnet system for generating a steady magnetic field $B_0$ in a measuring space and oriented mainly parallel to a z-axis of an orthogonal coordinate system having coordinates labeled x, y and z, the gradient coil system comprising:

a plurality of linear gradient coils, wherein each linear gradient coil generates a magnetic field oriented mainly parallel to the z-axis and with a lowest-order spatial variation comprising a first-order term depending on one direction, a plurality of additional gradient coils, wherein each additional gradient coil generates a magnetic field whose component in the direction of the steady magnetic field has a lowest-order spatial variation comprising one or more second-order terms depending on one or more directions in a predetermined manner, and control means for supplying the linear gradient coils and the additional gradient coils with excitation currents having predetermined amplitudes and time variations during an MR imaging experiment, such that the amplitude of the total magnetic field generated can be represented by the series $|B_{tot}|=B_0+G_x x+G_y y+G_z z+Ax^2+By^2+Cz^2+HOT$, where $G_x$, $G_y$ and $G_z$ are first-order coefficients having predetermined values at least one of which is not zero, and where A, B and C are second-order coefficients, and where HOT are third-order and higher-order terms, and such that any two of the second-order coefficients can be given predetermined values.

2. The system of claim 1 wherein at least one of the additional gradient coils generates a magnetic field having a z-component satisfying one of the following relations $K_1(z^2-x^2/2-y^2/2)$, or $K_2(x^2-y^2)$, or $K_3(xy)$, or $K_4(xz)$, or $K_5(yz)$, where $K_1$ to $K_5$ are constants.

3. The system of claim 1 wherein s, e, and a are a selection, an evolution and an acquisition direction, respectively, of the MR imaging experiment, and wherein the control means supplies excitation currents in order that the total magnetic field in a selection time period of the imaging experiment is dependent mainly on the selection direction according to $|B_{tot}|=B_0+G_s s+L_1 s^2+HOT$, where $G_s$ and $L_1$ are constants, and whereby warped slices are substantially avoided.

4. The system of claim 3 wherein s, e, and a are a selection, an evolution and an acquisition direction, respectively, of the MR imaging experiment, and wherein the control means supplies excitation currents in order that the magnetic field amplitude in a time period after selection is given by $|B_{tot}|=B_0-G_s s+L_2 a^2-L_1 s^2+HOT$, where $G_s$, $L_1$ and $L_2$ are constants.

5. The system of claim 1 wherein s, e, and a are a selection, an evolution and an acquisition direction, respectively, of the MR imaging experiment, and wherein the control means supplies excitation currents in order that the total magnetic field in an acquisition time period of the imaging experiment is given by $|B_{tot}|=B_0+G_a a+L_3 s+HOT$, where $G_a$ and $L_3$ are constants, and whereby the concomitant field depends on the selection coordinate substantially eliminating distortions in the acquisition direction.

6. The system of claim 1 wherein s, e, and a are a selection, an evolution and an acquisition direction, respectively, of the MR imaging experiment, and wherein the control means supplies excitation currents in order that the total magnetic field in an evolution time period of the imaging experiment is given by $|B_{tot}|=B_0+G_e e+L_3 s^2+HOT$, where $G_e$ and $L_3$ are constants, and whereby the concomitant field depends on the selection coordinate substantially eliminating distortions in the evolution direction.

7. The system of claim 1 wherein s, e, and a are a selection, an evolution and an acquisition direction, respectively, of the MR imaging experiment, and wherein the MR imaging experiment is EPI-like, and wherein the control means supplies excitation currents in order that the total magnetic field during an acquisition according to the imaging experiment (i) is given by $|B_{tot}|=B_0+G_a a+L_3 s^2+HOT$, in a first time period, and (ii) is given by $|B_{tot}|=B_0-G_a a+L_4 a^2-L_3 s^2+HOT$, in a second time period, and (iii) is given by $|B_{tot}|=B_0+G_a a-L_4 a^2+L_5 s^2+HOT$, followed by $|B_{tot}|=B_0-G_a a+L_6 a^2-L_5 s^2+HOT$, repetitively in succeeding time periods, where $G_a$, $L_3$, $L_4$, $L_5$, and $L_6$ are constants, and whereby quadratic contributions are substantially compensated.

8. The system of claim 1 wherein the gradient coil system comprises three coil systems generating magnetic fields with lowest-order spatial variations proportional to x, y and z, respectively, and wherein the additional gradient coils comprise five coil systems generating magnetic fields having z-components proportional to $z^2-x^2/2-y^2/2$, $x^2-y^2$, xy, xz and yz, respectively.

* * * * *